United States Patent [19]
Lavi et al.

[11] Patent Number: 6,108,240
[45] Date of Patent: Aug. 22, 2000

[54] IMPLEMENTATION OF EEPROM USING INTERMEDIATE GATE VOLTAGE TO AVOID DISTURB CONDITIONS

[75] Inventors: Yoav Lavi, Raannana; Oleg Dadashev, Hadera, both of Israel

[73] Assignee: Tower Semiconductor Ltd., Migdal Haemek, Israel

[21] Appl. No.: 09/243,977

[22] Filed: Feb. 4, 1999

[51] Int. Cl.[7] .................................................. G11C 16/04
[52] U.S. Cl. ............................... 365/185.29; 365/185.26
[58] Field of Search ......................... 365/185.29, 185.01, 365/185.05, 218, 185.24, 185.26

[56] References Cited

U.S. PATENT DOCUMENTS

| | | | |
|---|---|---|---|
| 4,366,555 | 12/1982 | Hu | 365/185 |
| 5,199,001 | 3/1993 | Tzeng | 365/218 |
| 5,764,572 | 6/1998 | Hammick | 365/189.01 |
| 5,768,192 | 6/1998 | Eitan . | |
| 5,838,626 | 11/1998 | Nakayama | 365/226 |

Primary Examiner—David Nelms
Assistant Examiner—David Lam
Attorney, Agent, or Firm—Bever, Hoffman & Harms, LLP; E. Eric Hoffman

[57] ABSTRACT

A method and apparatus for erasing a single floating gate transistor in an array of floating gate transistors is provided. A selected floating gate transistor, which is located in a first row and a first column of the array, is erased as follows. A low voltage $V_{LOW}$ (e.g., 0 Volts) is applied to the gate of each transistor in the first row of the array. An erase voltage $V_{ERASE}$ (e.g., 8 Volts) is applied to the drain of each transistor in the first column of the array. An intermediate voltage $V_{INT}$ (e.g., 3 Volts) is applied to the source of each transistor in the array, as well as to the drain of each transistor of the array that is not in the first column. Under these conditions, only the selected floating gate transistor is erased. Other floating gate transistors in the first column are not erased because the gate-to-drain voltages of these transistors are limited by the intermediate voltage $V_{INT}$ applied to their gates.

16 Claims, 3 Drawing Sheets

6,108,240

IMPLEMENTATION OF EEPROM USING INTERMEDIATE GATE VOLTAGE TO AVOID DISTURB CONDITIONS

FIELD OF THE INVENTION

The present invention relates to an electrically erasable programmable read-only memory (EEPROM). More specifically, the present invention relates to an EEPROM having individually programmable and erasable memory cells.

BACKGROUND OF THE INVENTION

Conventional floating gate type non-volatile memory can be selectively programmed to store data, code, or files. Floating gate type non-volatile memory can also be erased and reprogrammed, making this type of memory extremely useful in such applications as programmable logic devices, memories, and digital circuits.

In early floating gate type non-volatile memory, each memory cell was usually made up of multiple transistors, including a floating gate type storage transistor for data storage and a select transistor to enable programming and erasure of the storage transistor. However, in conventional floating gate type non-volatile memory, each memory cell is often made up of a single floating gate MOS transistor, typically an enhancement-mode device. The use of a single transistor improves memory density by reducing the size of the silicon chip required for a given memory size. The floating gate MOS transistor in a memory cell, or memory transistor, is programmed by charging its floating gate with electrons. When programmed, the excess electrons create a negative charge on the floating gate of the memory transistor, preventing or at least substantially reducing current flow through the memory transistor when a normal control voltage is applied to its gate terminal. The electrons remain on the floating gate even when power is removed from the circuit, allowing the memory cell to retain the stored data. The memory transistor is "erased" by removing the excess electrons from its floating gate, thereby allowing the memory transistor to conduct a normal current when a normal control voltage is applied to its gate terminal. Alternatively, the MOS transistor can be a depletion-mode device, in which case the memory cell would be programmed by removing electrons from its floating gate.

The memory cells in a floating gate type non-volatile memory array are typically individually programmable to allow the greatest flexibility in data storage. However, if a select transistor is not included in each memory cell, erasing has typically been a bulk process, in which memory cells are erased in blocks. In the present description, floating gate type non-volatile memory which must be erased in blocks will be referred to as flash memory. The number of memory cells in a block defines how efficiently a specified set of data can be erased from the memory array. The smaller the number of memory cells in a block, the more precisely such blocks can be mapped to the set of data to be erased. A large block often requires erasure of a large number of memory cells outside of the desired set of data to be erased. Such unwanted erasures require subsequent reprogramming of the original data, increasing the time required to modify the flash memory. Therefore, to maximize efficiency in the use of a flash memory, it is desirable to minimize block size, thereby providing as fine a resolution in erasing capability as possible.

In the present description, if the erase resolution is so fine that only the desired data is erased (i.e., it is possible to erase a single bit, a single byte or a single word), the memory is referred to as EEPROM (electrically erasable and programmable read only memory).

FIG. 1 shows a conventional flash memory 10, as described in U.S. Pat. No. 4,366,555, issued Dec. 28, 1982 to Hu. Flash memory 10 includes a 5×4 array of floating gate type transistors 101. The control gates in each row of transistors are coupled to an associated row voltage supply (100, 102, 104, 106 and 108) by an associated word line ($R_1$–$R_5$). Similarly, the source terminals in each column of transistors are coupled to an associated column voltage supply (90, 92, 94 and 96) by an associated column line ($C_1$–$C_4$). Finally, the drain terminal of each transistor in array 101 is commonly coupled to drain voltage supply 80.

Flash memory 10 is erased as follows. Column voltage supplies 90, 92, 94 and 96 ground all of the source regions, and drain voltage supply 80 grounds all of the drain regions. Selected row voltage supplies 100, 102, 104, 106 and 108 provide a 25 Volt signal to the associated row lines $R_1$–$R_5$. Under these conditions, any electrons stored in the floating gates of the transistors in the selected rows are discharged by tunneling. Flash memory 10 may therefore be capable of erasing on a row-by-row basis. Hu generally states that the drains of the memory devices could be selectively coupled to provide for selective erasure of individual devices. However, Hu provides no further instruction to indicate the specific manner in which the drains should be coupled to achieve such a result.

FIG. 2 shows another conventional flash memory 200, as described in U.S. Pat. No. 5,199,001, issued Mar. 30, 1993 to Tzeng. Flash memory 200 comprises a 2×2 array 201 of floating gate MOS transistors 212. The control gates of the transistors in the first and second rows are commonly coupled to word lines WL0 and WL1, respectively. The source terminals of the transistors in the first and second rows are commonly coupled to source lines SL0 and SL1, respectively. Finally, the drain terminals of the transistors in the first and second columns are commonly coupled to bit lines BL0 and BL1, respectively.

A circuit 240 is provided for selecting the individual source lines SL0 and SL1. Since the source lines SL0 and SL1 can be selected individually, a single row of transistors may receive a voltage on an associated source, thereby electrically erasing the data held by those transistors. The transistors of array 201 can therefore be erased on a row-by-row basis. However, as with flash memory 100 (FIG. 1), no means of erasing less than a single row is described.

Thus, the aforementioned flash memories do not provide an acceptable method or apparatus for erasing and reprogramming individual memory cells. Such bit-level erasing capability would provide desirable flexibility and efficiency in the use of floating gate type non-volatile memory. Accordingly, it is desirable to provide a method for erasing individual memory cells in a floating gate type non-volatile memory, wherein each memory cell comprises a single floating gate type transistor.

SUMMARY OF THE INVENTION

Accordingly, the present invention provides an apparatus and method for performing bit-level erasing in an array of floating gate type transistors. That is, the present invention provides an apparatus and method for implementing an EEPROM array in which each memory cell is a floating gate type transistor.

A selected floating gate transistor in an array of floating gate type transistors is erased as follows in accordance with one embodiment of the present invention. A first voltage is applied to the gate of each transistor in the row of the selected floating gate transistor. In one embodiment, the first voltage is a low voltage $V_{LOW}$ of 0 Volts. A second voltage is applied to the drain of each transistor in the column of the selected floating gate transistor. In one embodiment, the second voltage is an erase voltage $V_{ERASE}$ of 8 Volts. A third voltage is applied to the source of each floating gate transistor in the array, the drain of each transistor in the array that is not in the same column as the selected transistor, and the gate of each transistor in the array that is not in the same row as the selected transistor. In one embodiment, the third voltage is an intermediate voltage $V_{INT}$ of 3 Volts.

Under the above-described conditions, the gate-to-drain voltage of the selected transistor is 8 Volts, thereby causing electrons to tunnel from the floating gate to the drain of the selected transistor. As a result, the selected transistor is erased.

The gate-to-drain voltage of each other transistor in the same column as the selected transistor is equal to the erase voltage $V_{ERASE}$ minus the intermediate voltage $V_{INT}$, or 5 Volts (i.e., 8 Volts–3 Volts). The intermediate voltage $V_{INT}$ is selected such that the difference between the erase voltage $V_{ERASE}$ and the intermediate voltage $V_{INT}$ is insufficient to erase a transistor in the array. Thus, a gate-to-drain voltage of 5 Volts is insufficient to erase the other transistors in the same column as the selected transistor.

The gate-to-drain (and gate-to-source) voltages of the transistors that are not in the same column as the selected transistor do not exceed 3 Volts. As a result, these transistors are not erased. Consequently, only the selected transistor is erased, thereby advantageously providing per-bit erasing in the array.

In one embodiment, the selected transistor is programmed as follows. A programming voltage $V_{PROG}$ is applied to the gate of each transistor in the row of the selected transistor. The erase voltage $V_{ERASE}$ is applied to the drain of each transistor in the column of the selected transistor. The intermediate voltage $V_{INT}$ is applied to the source of each transistor in the array, the drain of each transistor in the array that is not in the same column as the selected transistor, and the gate of each transistor in the array that is not in the same row as the selected transistor.

Under these conditions, electrons are injected into the floating gate of the selected transistor by hot electron injection. However, the gate-to-drain (and gate-to-source) voltages of the non-selected transistors in the same column as the selected transistor do not exceed 5 Volts. As a result, none of the non-selected transistors is inadvertently erased. In addition, the non-selected transistors not in the same column as the selected transistor all have the same source and drain voltages, precluding the generation of hot electrons. Therefore, none of the non-selected transistors is inadvertently programmed.

The present invention will be more fully understood in light of the following detailed description taken together with the drawings.

DETAILED DESCRIPTION OF THE DRAWINGS

Figure 1:
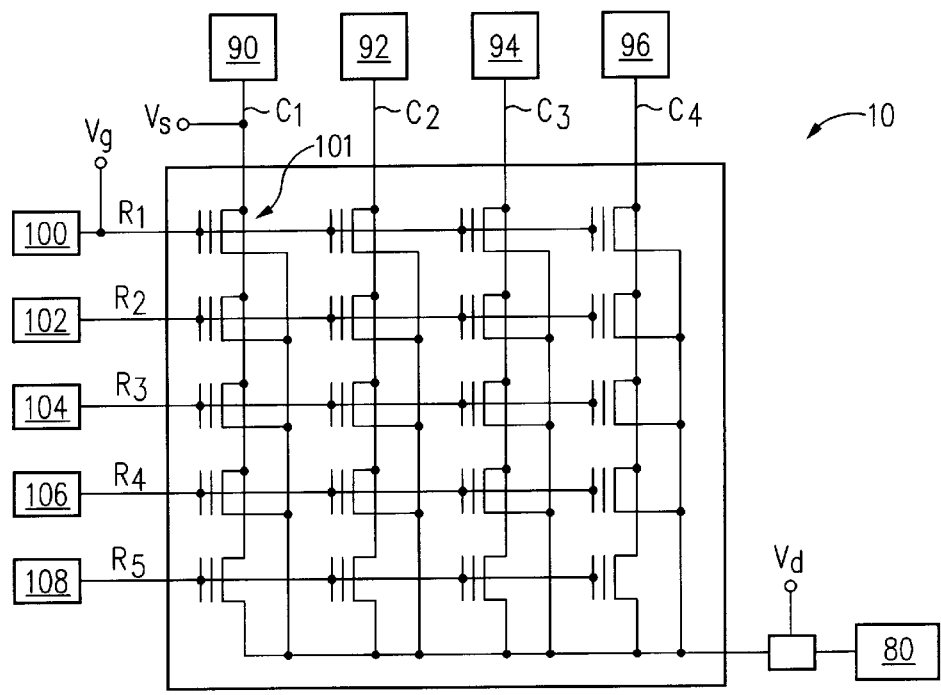
FIG. 1 is a schematic diagram of a conventional flash memory.
Figure 2:
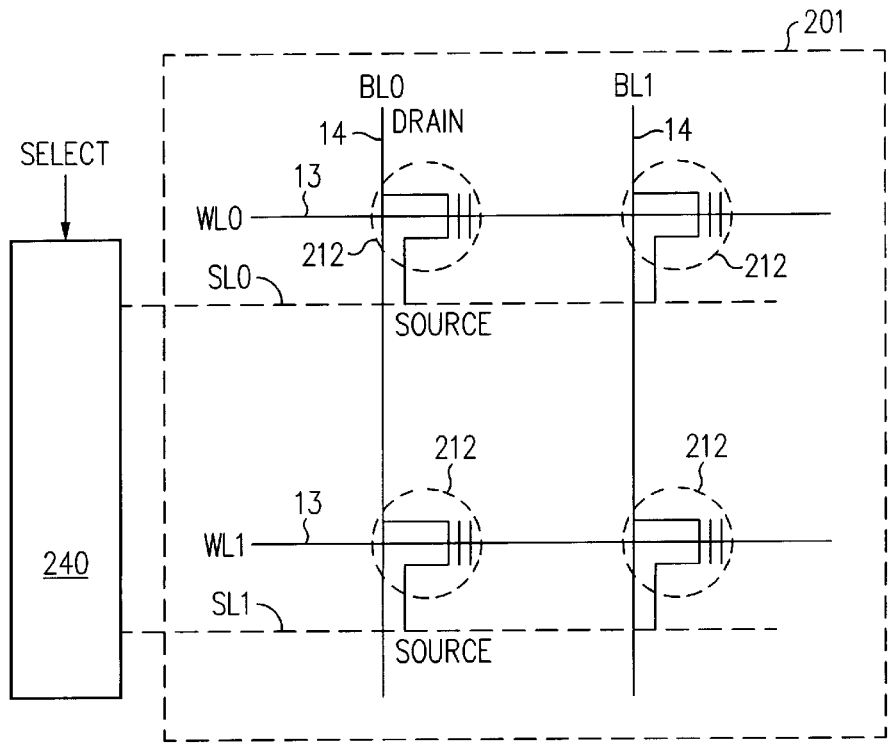
FIG. 2 is a schematic diagram of another conventional flash memory.
Figure 3:
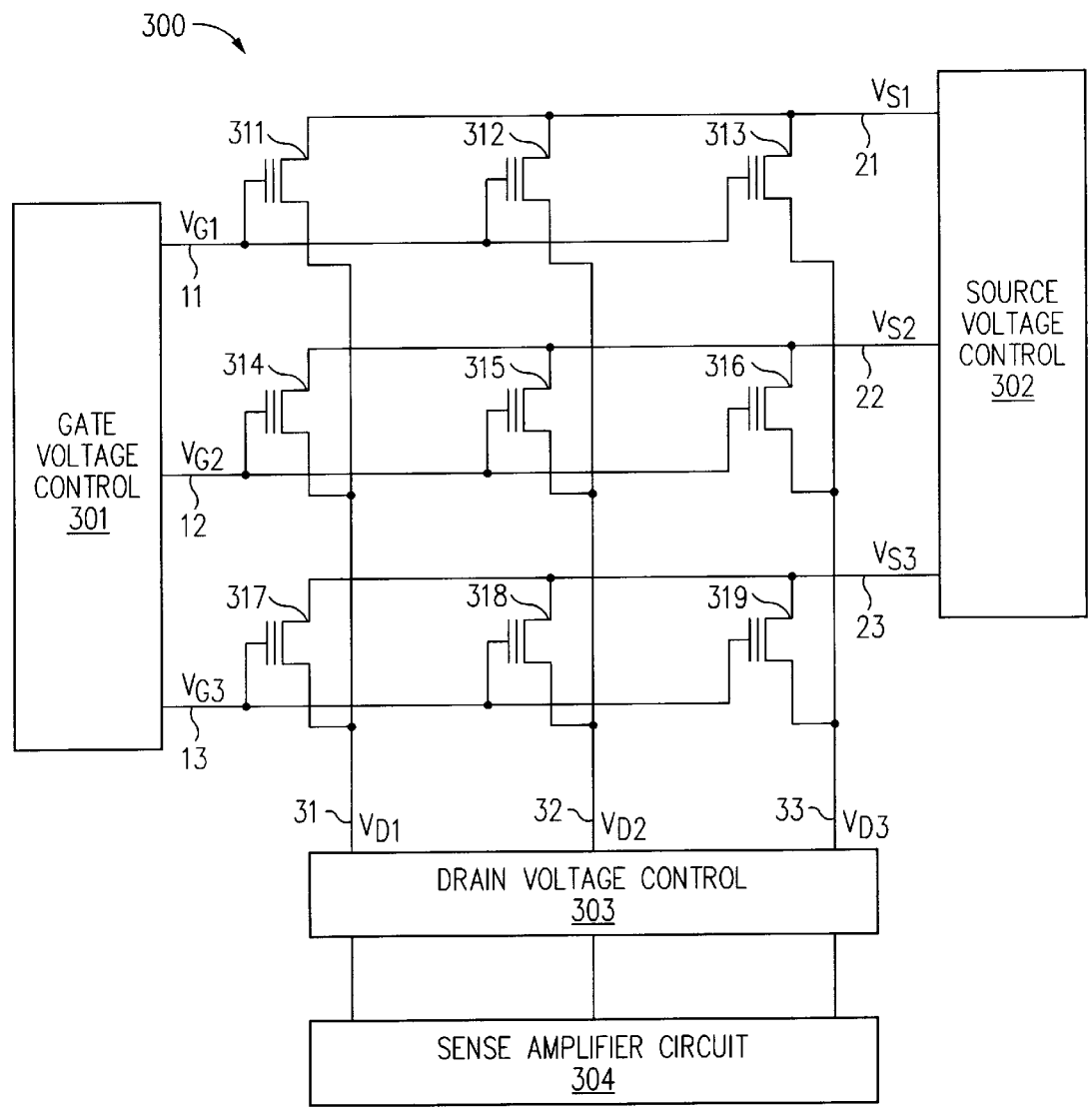
FIG. 3 is a schematic diagram of an EEPROM in accordance with the present invention.

FIG. 3 shows an EEPROM 300 in accordance with one embodiment of the present invention. EEPROM 300 comprises an array of floating gate enhancement-mode MOS transistors 311–319, gate voltage control circuit 301, source voltage control circuit 302, drain voltage control circuit 303, sense amplifier circuit 304, word lines 11–13, source lines 21–23, and drain lines 31–33. The illustrated array includes 3 rows and 3 columns of transistors for explanatory purposes only. In one embodiment of the present invention, the floating gates of transistors 311–319 comprise an electrically conductive material such as polysilicon. In another embodiment of the present invention, the floating gates of transistors 311–319 comprise a non-conductive material such as silicon nitride. Transistors having silicon nitride floating gates are described in more detail commonly owned co-filed U.S. patent application Ser. No. 09/244,529 [Attorney Docket No. TSL-001], by Yoav Lavi and Ishai Nachumovsky, entitled "EEPROM ARRAY USING 2-BIT NON-VOLATILE MEMORY CELLS AND METHOD OF IMPLEMENTING SAME", commonly owned co-filed U.S. patent application Ser. No. 09/244,317 [Attorney Docket No. TSL-003], by Ishai Nachumovsky, entitled "EEPROM ARRAY USING 2-BIT NON-VOLATILE MEMORY CELLS WITH SERIAL READ OPERATIONS", and commonly owned co-pending U.S. patent application Ser. No. 09/243,976 [Attorney Docket No. TSL-016], by Oleg Dadashev, entitled, "BIT LINE CONTROL CIRCUIT FOR A MEMORY ARRAY USING 2-BIT NON-VOLATILE MEMORY CELLS". It is understood that the present invention can be extended to arrays having other numbers of rows and columns in other embodiments. Each of word lines 11–13 is connected to the control gates of the transistors in a corresponding row of the array. More specifically, word line 11 is commonly connected to the control gates of transistors 311–313. Word line 12 is commonly connected to the control gates of transistors 314–316. Finally, word line 13 is commonly connected to the control gates of transistors 317–319. Word lines 11–13 are coupled to receive independently controlled voltages $V_{G1}$–$V_{G3}$, respectively, from gate voltage control circuit 301.

Each of source lines 21–23 is connected to the source terminals of the transistors in a corresponding row of the array. More specifically, source line 21 is commonly connected to the source terminals of transistors 311–313. Source line 22 is commonly connected to the source terminals of transistors 314–316. Finally, source line 23 is commonly connected to the source terminals of transistors 317–319. Source lines 21–23 are coupled to receive independently controlled voltages $V_{S1}$–$V_{S3}$, respectively, from source voltage control circuit 302.

Each of drain lines 31–33 is connected to the drain terminals of the transistors in a corresponding column of the array. More specifically, drain line 31 is commonly connected to the drain terminals of transistors 311, 314 and 317. Drain line 32 is commonly connected to the drain terminals of transistors 312, 315 and 318. Finally, drain line 33 is commonly connected to the source terminals of transistors 313, 316 and 319. Drain lines 31–33 are coupled to receive independently controlled voltages $V_{D1}$–$V_{D3}$, respectively, from drain voltage control circuit 303.

Drain voltage control circuit 303 is coupled to sense amplifier circuit 304. As described in more detail below, drain voltage control circuit 303 selectively couples drain lines 31–33 to sense amplifier circuit 304 during read operations.

As also described in more detail below, gate voltage control circuit 301, source voltage control circuit 302 and drain voltage control circuit 303 selectively apply voltages to memory transistors 311–319, thereby enabling the array to operate as an EEPROM. By varying the magnitudes of gate voltages $V_{G1}$–$V_{G3}$, source voltages $V_{S1}$–$V_{S3}$, and drain voltages $V_{D1}$–$V_{D3}$ between specific levels, transistors 311–319 can be individually programmed and erased.

In one embodiment, gate voltages $V_{G1}$–$V_{G3}$ are quad-level voltages, meaning that these voltages are switched between four different voltage levels during the operation of the array. The four voltage levels include a low voltage $V_{LOW}$, a programming voltage $V_{PROG}$, an intermediate voltage $V_{INT}$, and a read voltage $V_{READ}$. Drain voltages $V_{D1}$–$V_{D3}$ are tri-level voltages that are switched between an erase voltage $V_{ERASE}$, the low voltage $V_{LOW}$, and the intermediate voltage $V_{INT}$ during the operation of the array. Source voltages $V_{D1}$–$V_{D3}$ are held at the intermediate voltage $V_{INT}$ during the operation of the array.

The voltages $V_{PROG}$, $V_{ERASE}$, $V_{LOW}$, $V_{INT}$, and $V_{READ}$ are selected such that the following operating criteria are met. When the gate voltage of a transistor is equal to the low voltage $V_{LOW}$, and the drain voltage of the transistor is equal to the erase voltage $V_{ERASE}$, the transistor is erased after a predefined erase time interval. In one embodiment, the predefined erase time interval is on the order of milliseconds.

The voltages $V_{INT}$, $V_{ERASE}$, and $V_{PROG}$ are further selected such that when the gate voltage of a transistor is equal to the programming voltage $V_{PROG}$, the source voltage of the transistor is equal to the intermediate voltage $V_{INT}$, and the drain voltage of the transistor is equal to the erase voltage $V_{ERASE}$, the transistor is programmed after a predefined program time interval. In one embodiment, the predefined program time interval is on the order of microseconds.

The voltages $V_{READ}$, $V_{INT}$ and $V_{LOW}$ are further selected such that when the gate voltage of a selected transistor is equal to the read voltage $V_{READ}$, the source voltage of the selected transistor is equal to the intermediate voltage $V_{INT}$, and the drain voltage of the selected transistor is equal to the low voltage $V_{LOW}$, it is possible to determine if the transistor is programmed or erased by measuring the current through the transistor. Stated another way, the state of the selected transistor is read under these conditions. The read operation takes on the order of nano-seconds.

The voltage $V_{INT}$ is further selected such that when the gate voltage of a selected transistor is equal to the intermediate voltage $V_{INT}$, the source and drain voltages of the transistor can be maintained at any voltage between the low voltage $V_{LOW}$ and the erase voltage $V_{ERASE}$, inclusive, without disturbing the state of the transistor. That is, a transistor will neither be programmed nor erased when the gate of the transistor is maintained at the intermediate voltage $V_{INT}$. The state of the transistor will not be disturbed, even if numerous program and erase disturb conditions exist.

In one embodiment of the present invention, the programming voltage $V_{PROG}$ is equal to 10 Volts, the erase voltage $V_{ERASE}$ is equal to 8 Volts, the low voltage $V_{LOW}$ is equal to 0 Volts, the intermediate voltage $V_{INT}$ is equal to 3 Volts, and the read voltage $V_{READ}$ is equal to 5 Volts. To program a selected transistor in the array, the programming voltage $V_{PROG}$ must be applied to the control gate of the transistor, thereby forming a channel region in the transistor. The intermediate voltage $V_{INT}$ is applied to the source of the transistor and the erase voltage $V_{ERASE}$ is applied to the drain of the transistor, thereby causing electrons to be injected into the floating gate of the transistor by hot electron injection.

Thus, to program transistor 315, gate voltage control circuit 301 provides a gate voltage $V_{G2}$ equal to 10 Volts ($V_{PROG}$) on word line 12. Drain voltage control circuit 303 provides a drain voltage $V_{D2}$ equal to 8 Volts ($V_{ERASE}$) on drain line 32. Source voltage control circuit 302 provides a source voltage $V_{S2}$ of 3 Volts ($V_{INT}$) on source line 22. All of the other gate, source and drain voltages (i.e., $V_{G1}$, $V_{G3}$, $V_{S1}$–$V_{S3}$ and $V_{D1}$–$V_{D3}$) are set equal to 3 Volts ($V_{INT}$) by the corresponding voltage control circuits 301–303. The resulting voltages on transistors 311–319 are shown below in Table 1.

TABLE 1

| Transistor(s) | Gate Voltage | Source Voltage | Drain Voltage |
|---|---|---|---|
| 311, 313 317, 319 | 3 Volts | 3 Volts | 3 Volts |
| 312, 318 | 3 Volts | 3 Volts | 8 Volts |
| 314, 316 | 10 Volts | 3 Volts | 3 Volts |
| 315 | 10 Volts | 3 Volts | 8 Volts |

The 10 Volt signal applied to the control gate of transistor 315 creates a channel region between the source and drain regions of transistor 315. Electrons are accelerated from the source region of transistor 315, which is held at the intermediate voltage of 3 Volts, to the drain region of transistor 315, which is held at the erase voltage of 8 Volts. Under these conditions, a desired quantity of electrons are injected into the floating gate of transistor 315 by hot electron injection. Because transistor 315 is the only transistor in the array to which this unique set of voltages is applied, transistor 315 is the only transistor in the array that is programmed.

Under the conditions listed in Table 1, memory transistors 311, 313, 317, and 319 each have gate, source and drain voltages of 3 Volts. Because the gate, source and drain regions of these transistors are held at the same voltage, transistors 311, 313, 317 and 319 are neither programmed nor erased.

Moreover, under the conditions listed in Table 1, the control gates of transistors 314 and 316 each receive a 10 Volt signal. The source and drain terminals of transistors 314 and 316 are set equal to the intermediate voltage $V_{INT}$ of 3 Volts. Because the source and drain regions of transistors 314 and 316 are set to the same voltage, electrons are not accelerated between the source and drain regions, and hot electron injection does not occur within transistors 314 and 316. As a result, transistors 314 and 316 are not programmed by hot electron injection under the conditions listed in Table 1. Moreover, the relatively short duration of the programming operation (i.e., on the order of micro-seconds) ensures that Fowler-Nordheim tunneling does not occur, even in the presence of the relatively high gate-to-drain voltage of 7 Volts (10 Volts–3 Volts). (Note that transistors 314 and 316 are not erased under these conditions.) The identical source and drain voltages applied to transistors 314 and 316 also reduce power consumption in EEPROM 300 by preventing any current flow through transistors 314 and 316.

Finally, under the conditions listed in Table 1, the drains of transistors 312 and 318 are set to 8 Volts and the gates and sources of transistors 312 and 318 are set to 3 Volts. Under these conditions, the gate voltages applied to transistors 312 and 318 are too low to create channel regions that will support hot electron injection. For this reason, transistors 312 and 318 are not programmed under these conditions. Moreover, by applying the intermediate voltage $V_{INT}$ of 3 Volts to the gates of transistors 312 and 318, the gate-to-drain voltages of these transistors are limited to about 5 Volts (i.e., 8 Volts–3 Volts). These 5 Volt gate-to-drain voltages are not large enough to cause electrons stored in the floating gates of these transistors to tunnel to the drains of these transistors. As a result, the intermediate voltage $V_{INT}$ applied to the gates of transistors 312 and 318 prevents these transistors from being erased.

After the array has been programmed, a read operation can be performed to determine the states (i.e., programmed or erased) of transistors 311–319. During the read operation, the read voltage $V_{READ}$ is applied to the control gate of the transistor to be read, the intermediate voltage $V_{INT}$ is applied to the source of the transistor to be read, and the drain of the transistor to be read is coupled to a sense amplifier. The sense amplifier connects the drain of the transistor to a voltage of about 0 Volts, and then measures the resulting current flow to determine whether the transistor is programmed or erased. The resulting current flow will be larger if the transistor is erased.

For example, to read transistor 315, gate voltage $V_{G2}$ is set to the read voltage $V_{READ}$ of 5 Volts, source voltage $V_{S2}$ is set to the intermediate voltage $V_{INT}$ of 3 Volts, and drain line 32 is routed through drain voltage control circuit 303 to sense amplifier circuit 304. Within sense amplifier circuit 304, a voltage of about 0 Volts is applied to drain line 32. The other gate voltages $V_{G1}$ and $V_{G3}$, are held at 0 Volts, and the other source and drain voltages $V_{S1}$, $V_{S3}$, $V_{D1}$ and $V_{D3}$ are held at the intermediate voltage $V_{INT}$ of 3 Volts by the associated voltage control circuits. Table 2 illustrates the voltages applied to transistors 311–319 for this read operation.

TABLE 2

| Transistor(s) | Gate Voltage | Source Voltage | Drain Voltage |
| --- | --- | --- | --- |
| 311, 313 317, 319 | 0 Volts | 3 Volts | 3 Volts |
| 312, 318 | 0 Volts | 3 Volts | 0 Volts (Sense Amp) |
| 314, 316 | 5 Volts | 3 Volts | 3 Volts |
| 315 | 5 Volts | 3 Volts | 0 Volts (Sense Amp) |

During the present read operation, the gates of transistors 314–316 are driven by a read voltage $V_{READ}$ of 5 Volts. Of these three transistors 314–316, only transistor 315 is connected to the sense amplifier circuit 304. Transistors 312 and 318, which are also connected to the sense amplifier circuit 304, do not affect the current flow in drain line 32 because the 0 Volt gate voltages $V_{G1}$ and $V_{G3}$, respectively, prevent them from conducting. If transistor 315 is in a programmed state, the threshold voltage of transistor 315 is greater than 5 Volts. As a result, the 5 Volt gate voltage $V_{G2}$ is not high enough to induce a channel region in transistor 315, and transistor 315 will not conduct current. Consequently, sense amplifier circuit 304 will detect an absence of current flow, and in response, indicate a first (programmed) logic state.

Conversely, if transistor 315 is in an erased state, the threshold voltage of transistor 315 is less than 5 Volts. As a result, the 5 Volt gate voltage $V_{G2}$ is high enough to induce a channel region in transistor 315, thereby causing current to flow to sense amplifier circuit 304. Sense amplifier circuit 304 detects the presence of current flow, and in response, indicates a second (erased) logic state. Transistors 311–314 and 316–319 are not disturbed because the voltages applied to these transistors are not high enough to cause program or erase conditions to exist.

In an alternative embodiment, the read voltage $V_{READ}$ is applied to the control gate of the transistor to be read and the low voltage $V_{LOW}$ is applied to the source of the transistor to be read. The sense amplifier then connects the drain of the transistor to be read to a voltage roughly equal to the intermediate voltage $V_{INT}$ and measures the resulting current to determine whether the transistor is programmed or erased. In yet another embodiment, sense amplifier circuit 304 is coupled to source voltage control circuit 302, rather than drain voltage control circuit 303. Source voltage control circuit 302 would then selectively couple source lines 21–23 to sense amplifier 304 during read operations. In this embodiment, source voltage control circuit 302 and drain voltage control circuit 303 apply voltages to the source and drain lines in a manner consistent with the above-described read embodiments.

An erase operation will now be described. To erase a selected transistor within the array, gate voltage control circuit 301 applies the low voltage $V_{LOW}$ to the control gate of the selected transistor, and drain voltage control circuit 303 applies the erase voltage $V_{ERASE}$ to the drain of the selected transistor. All other voltages in the array are set to the intermediate voltage $V_{INT}$ by the associated voltage control circuits.

For example, to erase transistor 315, gate voltage control circuit 301 provides a gate voltage $V_{G2}$ equal to 0 Volts ($V_{LOW}$) on word line 12. Drain voltage control circuit 303 provides a drain voltage $V_{D2}$ equal to 8 Volts ($V_{ERASE}$) on drain line 32. Source voltage control circuit 302 provides a source voltage $V_{S2}$ of 3 Volts ($V_{INT}$) on source line 22. All of the other gate, source and drain voltages (i.e., $V_{G1}$, $V_{G3}$, $V_{S1}$–$V_{S3}$ and $V_{D1}$–$V_{D3}$) are set equal to 3 Volts ($V_{INT}$) by the corresponding voltage control circuits 301–303. The resulting voltages on transistors 311–319 are shown below in Table 3.

TABLE 3

| Transistor(s) | Gate Voltage | Source Voltage | Drain Voltage |
| --- | --- | --- | --- |
| 311, 313 317, 319 | 3 Volts | 3 Volts | 3 Volts |
| 312, 318 | 3 Volts | 3 Volts | 8 Volts |
| 314, 316 | 0 Volts | 3 Volts | 3 Volts |
| 315 | 0 Volts | 3 Volts | 8 Volts |

As shown in Table 3, transistor 315 has a control gate voltage of 0 Volts, and a drain voltage of 8 Volts. The 8 Volt gate-to-drain voltage is high enough to cause electrons stored in the floating gate of transistor 315 to tunnel to the drain of transistor 314 through the dielectric layer separating the floating gate from the drain. As a result, transistor 315 is erased.

The control gates of transistors 312 and 318 are held at the intermediate voltage $V_{INT}$ of 3 Volts, while the drains of transistors 312 and 318 are held at the erase voltage $V_{ERASE}$ of 8 Volts. As a result, the gate-to-drain voltages of transistors 312 and 318 are equal to 5 Volts. As discussed above, a gate-to-drain voltage of 5 Volts is insufficient erase transistors 312 and 318. That is, electrons will not tunnel from the floating gate to the drain in response to a gate-to-drain voltage of 5 Volts. Transistors 312 and 318 will also not be programmed since their 3 Volt ($V_{INT}$) gate voltages are insufficient to form channel regions to provide hot electrons for injection into their floating gates.

Under the erase conditions listed in Table 3, the gate-to-drain voltages of transistors 311, 313, 314, 316, 317, and 319 do not exceed 3 Volts. As a result, these transistors are not erased during the erase operation. Consequently, only transistor 315 is erased, as is desired in a bit-level erasable EEPROM.

In a variation of the above-described erase operation, the source of the selected transistor, rather than the drain, is held at the erase voltage $V_{ERASE}$ of 8 Volts. The drain of the selected transistor is held at the intermediate voltage $V_{INT}$ of 3 Volts. Under these conditions, the selected transistor is erased in the manner described above.

Multiple transistors in the array can be simultaneously erased, if desired. For example, if gate voltage control circuit 301 provides a low voltage $V_{LOW}$ of 0 Volts to word lines 11–13, and drain voltage control circuit 303 provides an erase voltage $V_{ERASE}$ of 8 Volts to drain lines 31–33, then all of transistors 311–319 will be erased. Therefore, the present invention provides the efficiency and adaptability benefits of bit-level erasing while still retaining bulk-erase capability.

Similarly, if gate voltage control circuit 301 provides a low voltage $V_{LOW}$ of 0 Volts to word lines 11–12, and drain voltage control circuit 303 provides an erase voltage $V_{ERASE}$ of 8 Volts to drain line 32 (and $V_{G3}$, $V_{S1}$–$V_{S3}$, $V_{D1}$ and $V_{D3}$ are held at the intermediate voltage $V_{INT}$ of 3 Volts), then transistors 312 and 315 will be erased.

In an alternative embodiment, gate voltages $V_{G1}$–$V_{G3}$ are tri-level voltages, rather than quad-level voltages. That is, the gate voltages $V_{G1}$–$V_{G3}$ are switched between three different voltage levels during the operation of the array. In this embodiment, the read voltage $V_{READ}$ of 5 Volts described above is not used. Instead, this read voltage $V_{READ}$ is replaced with the intermediate voltage $V_{INT}$ of 3 Volts. Thus, the array operates in the same manner described above, except that during a read operation, the gate of the selected transistor is held at a voltage of 3 Volts rather than a voltage of 5 Volts.

Figure 4:
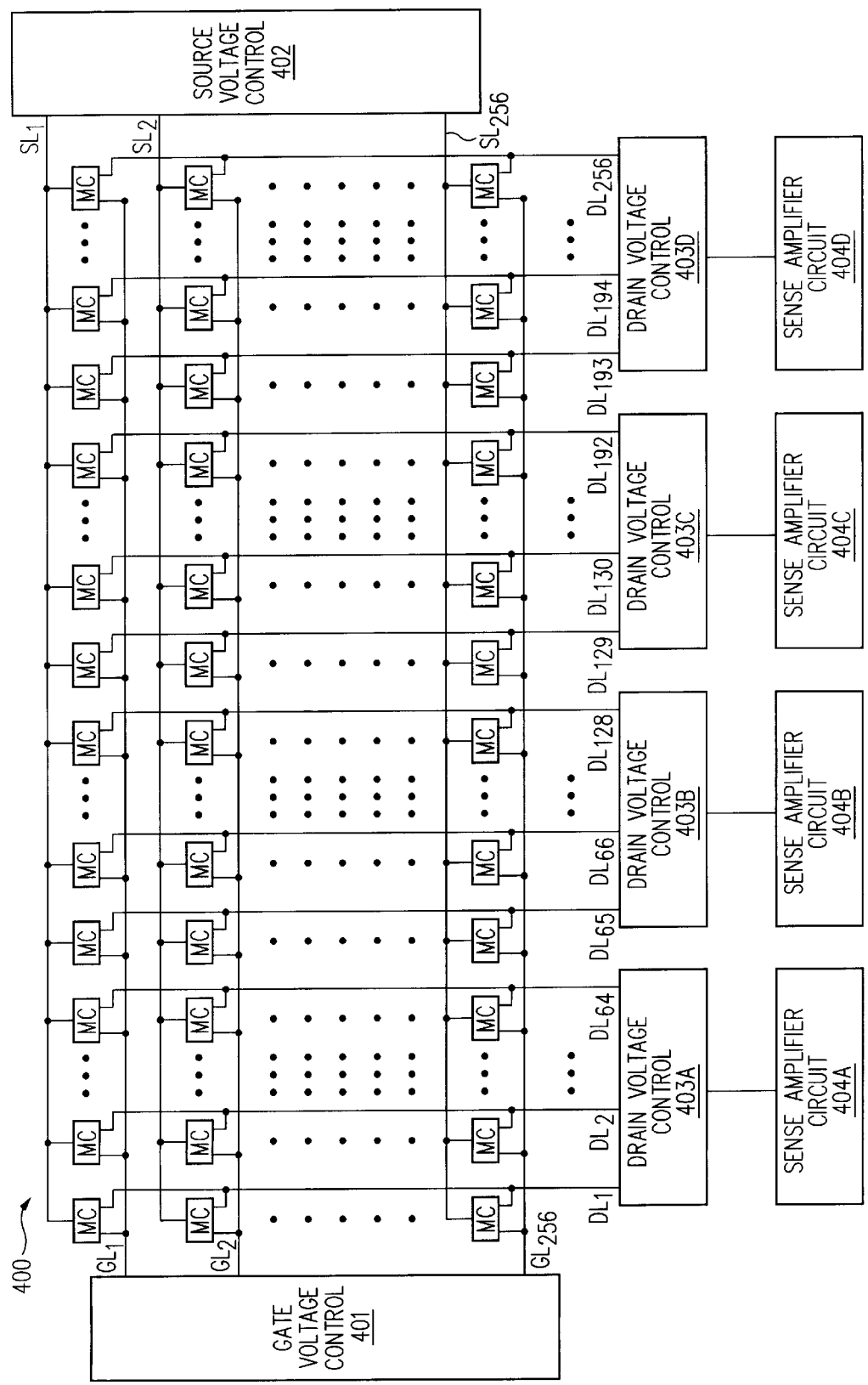
FIG. 4 is a schematic diagram of an EEPROM in accordance with another embodiment of the present invention.

FIG. 4 is a block diagram of a EEPROM 400 that illustrates another aspect of the present invention. EEPROM 400 includes a 256×256 array of memory cells MC, gate voltage control circuit 401, source voltage control circuit 402, drain voltage control circuits 403A–403D, sense amplifier circuits 404A–404D, 256 gate lines $GL_1$–$GL_{256}$, 256 source lines $SL_1$–$SL_{256}$, and 256 drain lines $DL_1$–$DL_{256}$. Each of the memory cells MC is connected to a gate line, a source line and a drain line in the same manner as the above-described memory cells 311–319. Gate voltage control circuit 401 and source voltage control circuit 402 operate in the same manner as gate voltage control circuit 301 and source voltage control circuit 302, respectively (FIG. 3).

In EEPROM 400, each of the drain voltage control circuits 403A–403D is coupled to 64 corresponding drain lines. Each of drain voltage control circuits 403A–403D is also coupled to a corresponding one of sense amplifier circuits 404A–404D. Thus, there are four drain voltage control circuits 403A–403D and four corresponding sense amplifier circuits 404A–404D. Each of drain voltage control circuits 403A–403D and its corresponding sense amplifier circuit 404A–404D is controlled to program, erase or read one bit at a time, in the same manner described above for drain voltage control circuit 303 and sense amplifier circuit 304 (FIG. 3). Drain voltage control circuits 403A–403D and their corresponding sense amplifier circuits 404A–404D operate in parallel, such that EEPROM 400 processes 4-bit words. For example, a 4-bit word can be stored by the memory cell in row 1, column 1, the memory cell in row 1, column 65, the memory cell in row 1, column 129, and the memory cell in row 1, column 193. By following the teachings of EEPROM 400, EPROM's having other word lengths (e.g., 8 bits, 16 bits, 32 bits) can similarly be formed.

Although the present invention has been described in connection with a particular embodiment, it is understood that this invention is not limited to the embodiment disclosed. Various modifications will be readily apparent to one of ordinary skill in the art. For example, depletion-mode MOS transistors could be used in place of enhancement mode MOS transistors 311–319. In addition, various other voltage levels could be used other than those described for exemplary purposes. Thus, the invention is limited only by the following claims.

We claim:

1. An electrically erasable programmable read-only memory (EEPROM) comprising:

a memory array including a plurality of floating gate type transistors arranged in a plurality of rows and columns, each of the floating gate type transistors comprising a control gate, a source terminal, and a drain terminal;

a first word line coupled to the control gate of each of the floating gate type transistors in a first row of the memory array; and a gate voltage control circuit coupled to the first word line, wherein the gate voltage control circuit is configured to supply four separate voltages to the first word line during program, erase, read operation of the memory.

2. An electrically erasable programmable read-only memory (EEPROM) comprising:

a memory array including a plurality of floating gate type transistors arranged in a plurality of rows and columns, each of the floating gate type transistors comprising a control gate, a source terminal, and a drain terminal;

a first word line coupled to the control gate of each of the floating gate type transistors in a first row of the memory array; and a gate voltage control circuit coupled to the first word line, wherein the gate voltage control circuit is configured to supply four separate voltages to the first word line, and wherein the gate voltage control circuit is configured to apply a first voltage to the first word line during a program operation, a second voltage to the first word line during an erase operation and during a read operation to a second row of the memory array, a third voltage to the first word line during a read operation to the first row of the memory array, and a fourth voltage to the first word line during a program or erase operation to the second row of the memory array.

3. An electrically erasable programmable read-only memory (EEPROM) comprising:

a memory array including a plurality of floating gate type transistors arranged in a plurality of rows and columns, each of the floating gate type transistors comprising a control gate, a source terminal, and a drain terminal;

a first word line coupled to the control gate of each of the floating gate type transistors in a first row of the memory array; and a gate voltage control circuit coupled to the first word line, wherein the gate voltage control circuit is configured to apply a first voltage to the first word line during a program operation, a second voltage to the first word line during an erase operation, and a third voltage to the first word line during a read operation, and wherein the gate voltage control circuit is further configured to apply the second voltage to the first word line during a read operation to a second row of the memory array, and the third voltage to the first word line during a program or erase operation to the second row of the memory array.

4. A method for operating an electrically erasable programmable read-only memory (EEPROM) having a first row of floating gate type transistors, wherein each of the transistors in the first row has a control gate coupled to a first word line, the method comprising the steps of:

providing a first voltage to the first word line to perform a read operation in the first row;

providing a second voltage to the first word line to perform a program operation in the first row;

providing a third voltage to the first word line to perform an erase operation in the first row; and providing a fourth voltage to the first word line when a program or erase operation is not being performed on the first row.

5. The method of claim 4, wherein the fourth voltage is between the second and third voltages.

6. A method of erasing a selected floating gate transistor in an array of floating gate type transistors, wherein the selected floating gate transistor is located in a first row and a first column of the array, the method comprising the steps of:

applying a first voltage to the gate of each transistor in the first row of the array;

applying a second voltage to the drain of each transistor in the first column of the array;

applying a third voltage to the source of each transistor in the array; and applying the third voltage to the drain of each transistor of the array that is not in the first column.

7. The method of claim 6, wherein the second voltage is greater than the first voltage, and the third voltage is between the first and second voltages.

8. The method of claim 7, wherein the first, second and third voltages are about 0 Volts, 8 Volts and 3 Volts, respectively.

9. An electrically erasable programmable read-only memory (EEPROM) comprising:

a memory array including a plurality of floating gate type transistors arranged in a plurality of rows and columns, each of the floating gate type transistors comprising a control gate, a source terminal, and a drain terminal;

a plurality of word lines, each of the plurality of word lines being coupled to the control gates of the floating gate type transistors in a row of the memory array;

a plurality of drain lines, each of the plurality of drain lines being coupled to the drain terminals of the floating gate type transistors in a column of the memory array;

a gate voltage control circuit coupled to the plurality of word lines, wherein the gate voltage control circuit is configured to independently supply three separate voltages to the plurality of word lines; and a drain voltage control circuit coupled to the plurality of drain lines, wherein the drain voltage control circuit is configured to independently supply two separate voltages to the plurality of drain lines, wherein the gate voltage control circuit and the drain voltage control circuit enable individual floating gate type transistors in the memory array to be selectively erased.

10. The EEPROM of claim 9, wherein the gate voltage control circuit is configured to apply a first voltage to a first of the plurality of word lines during a program operation, a second voltage to the first of the plurality of word lines during an erase operation, and a third voltage to the first of the plurality of word lines during a read operation.

11. The EEPROM of claim 10, wherein the gate voltage control circuit is further configured to apply the second voltage to the first of the plurality of word lines during a read operation to a second row of the memory array, and the third voltage to the first of the plurality of word lines during a program or erase operation to the second row of the memory array.

12. The EEPROM of claim 9, further comprising:

a plurality of source lines, each of the plurality of source lines being coupled to the source terminals of the floating gate type transistors in a row of the memory array; and a source voltage control circuit coupled to the plurality of source lines, wherein the source voltage control circuit is configured to supply a single voltage to the plurality of source lines.

13. The EEPROM of claim 12 further comprising a sense amplifier circuit coupled to the plurality of drain lines.

14. The EEPROM of claim 12 further comprising a sense amplifier circuit coupled to the plurality of source lines.

15. The EEPROM of claim 9, wherein the gate voltage control circuit is configured to supply four separate voltages to the first word line.

16. The EEPROM of claim 15, wherein the gate voltage control circuit is configured to apply a first voltage to the first word line during a program operation, a second voltage to the first word line during an erase operation and during a read operation to a second row of the memory array, a third voltage to the first word line during a read operation to the first row of the memory array, and a fourth voltage to the first word line during a program or erase operation to the second row of the memory array.

* * * * *